United States Patent [19]

Pleva

[11] Patent Number: 5,051,622

[45] Date of Patent: Sep. 24, 1991

[54] POWER-ON STRAP INPUTS

[75] Inventor: Robert M. Pleva, Livermore, Calif.

[73] Assignee: Chips and Technologies, Inc., San Jose, Calif.

[21] Appl. No.: 607,206

[22] Filed: Oct. 30, 1990

Related U.S. Application Data

[63] Continuation of Ser. No. 433,476, Nov. 8, 1989, abandoned.

[51] Int. Cl.$^5$ .......................................... H03K 19/177
[52] U.S. Cl. .................................... 307/465; 307/243
[58] Field of Search ...................... 307/465, 272.3, 243

[56] References Cited

U.S. PATENT DOCUMENTS

| | | | |
|---|---|---|---|
| 4,717,912 | 1/1988 | Harvey et al. ....................... | 307/465 |
| 4,771,285 | 9/1988 | Agrawal et al. .................... | 207/465 |
| 4,772,811 | 9/1988 | Fujioka et al. ...................... | 307/465 |
| 4,783,606 | 11/1988 | Goetting ............................. | 307/465 |
| 4,940,909 | 7/1990 | Mulder et al. .................... | 307/272.3 |
| 4,985,641 | 1/1991 | Nagayama et al. ............. | 307/272.3 |
| 4,985,650 | 1/1991 | Schüett et al. ...................... | 307/465 |

OTHER PUBLICATIONS

Declaration of Mark S. Garetz plus exhibits.

*Primary Examiner*—David Hudspeth
*Assistant Examiner*—Andrew Sanders
*Attorney, Agent, or Firm*—Townsend and Townsend

[57] ABSTRACT

A technique for providing external mode select information to a chip capable of operating in different modes without adding pin overhead. One of the normal signal pins of the chip is used as an input pin for a brief period of time at power-on before the chip becomes fully operational. During this time, a mode select signal from outside is communicated onto the pin and latched into the chip, where it remains during subsequent normal operation of the chip.

8 Claims, 3 Drawing Sheets

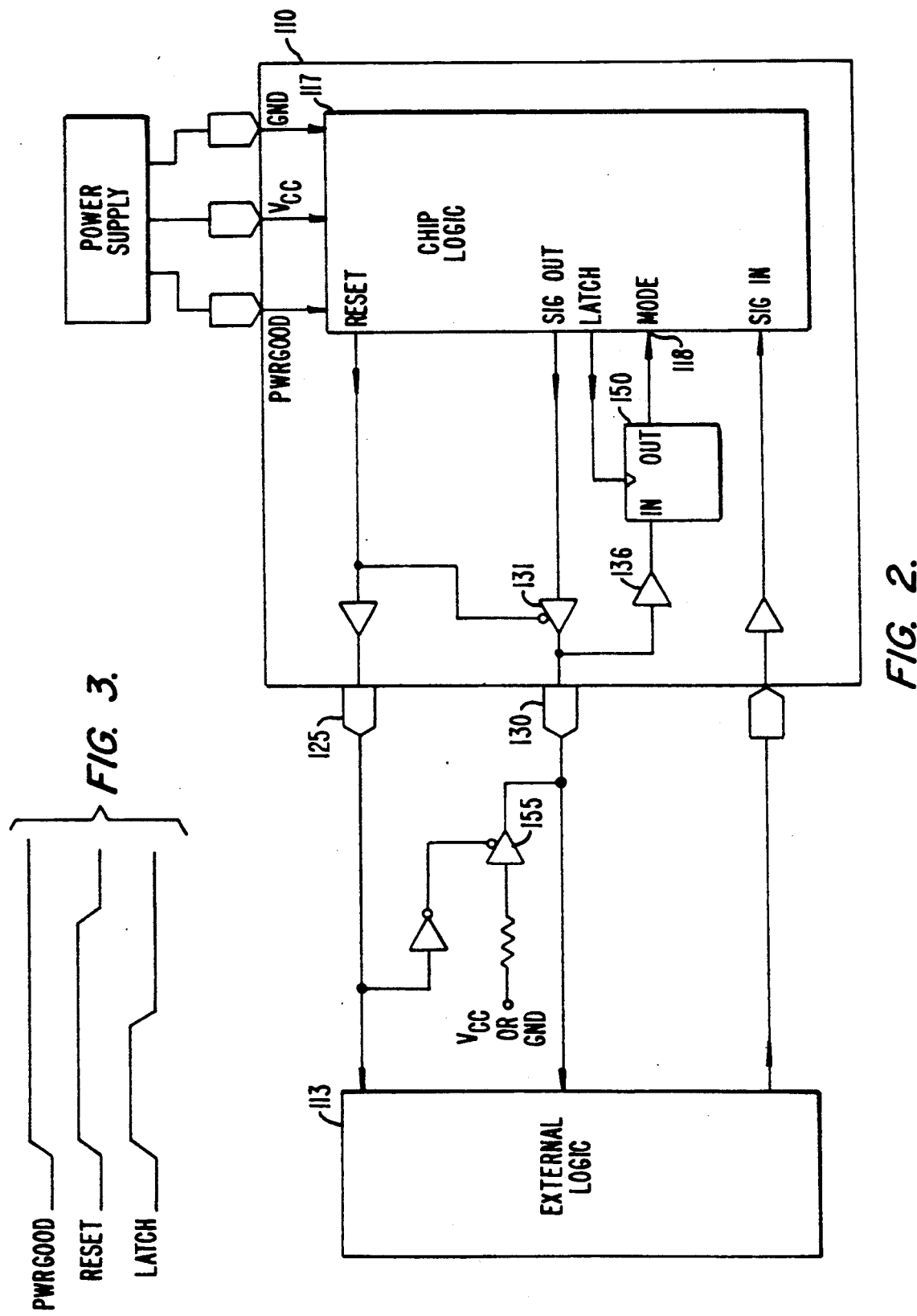

POWER-ON STRAP INPUTS

This is a continuation of application Ser. No. 433,476, filed Nov. 8, 1989, now abandoned.

BACKGROUND OF THE INVENTION

The present invention relates generally to digital logic, and more specifically to a technique for communicating external information to a logic circuit on a semiconductor chip.

As semiconductor products have grown more sophisticated, the need for multi-purpose devices has increased. Thus, a large chip, such as a sophisticated controller circuit, may be required to operate in a number of modes, depending on the configuration of the system within which it is embedded. This is typically implemented by providing circuitry on the chip, responsive to one or more mode select signals or signal levels from outside the chip, for reconfiguring the chip circuitry or otherwise defining its operation. Thus, the chip might be provided with a number of dedicated pins that are tied high or low (with off-chip pull-up or pull-down resistors), as required for a particular configuration.

Fortunately, chip designers are now able to fit an incredibly large amount of sophisticated logic on a semiconductor chip, so it is possible to implement such multi-mode operation. Unfortunately, the limiting factor may have shifted from the number of active devices that can be put on the chip to the number of input or output pins that are available on relatively standard and economical packaging. In concrete terms, there are commercially available 160-pin packages costing a few dollars. Were a device to require 161 pins, a much more expensive package, perhaps a custom design, would be called for. Thus, a pin saved may well translate into many pennies earned.

SUMMARY OF THE INVENTION

The present invention provides a technique for providing external mode select information to a chip capable of operating in different modes without adding pin overhead.

In brief, the invention contemplates using one of the normal signal pins of the chip as an input pin for a brief period of time at power-on before the chip becomes fully operational. During this time, a mode select signal from outside is communicated onto the pin and latched into the chip, where it remains during subsequent normal operation of the chip.

In a preferred embodiment, a chip has internal logic coupled to various signal pins through buffers (drivers or receivers as the case may be). The internal logic also includes portions responsive to a mode select signal to be supplied from outside the chip. According to the invention the mode select signal does not come onto the chip on a dedicated pin, but is supplied via a circuit path from one of the normal signal pins. The signal pin communicates with the input of a latch, and the latch output is coupled to the portion of the chip logic that responds to the mode select signal. During a reset period starting at power-on, the signal pin is isolated from circuitry that would normally drive the signal pin and the mode select signal is communicated to the pin. The mode select signal passes to the input of the latch. A latch signal clocks the latch part way through the reset period in order to hold the state of the pin for later use by the circuitry on the chip. The normal signal path is enabled at the end of the reset period so the chip can operate normally.

In some instances, the desired mode select signal can be provided by an off-chip pull-up or pull-down resistor. However, in a circumstance where the signal pin communicates with external circuitry that might have its own pull-up or pull-down resistor, the pin is driven actively only during the reset period.

A further understanding of the nature and advantages of the present invention may be realized by reference to the remaining portions of the specification and the attached drawings.

BRIEF DESCRIPTION OF THE DRAWINGS

FIG. 2 is a block diagrams of a first embodiment of the present invention for implementing a multi-mode feature on a chip;

FIG. 3 is a timing diagram of the signals for implementing the technique of the present invention.

DESCRIPTION OF SPECIFIC EMBODIMENTS

Figure 1:
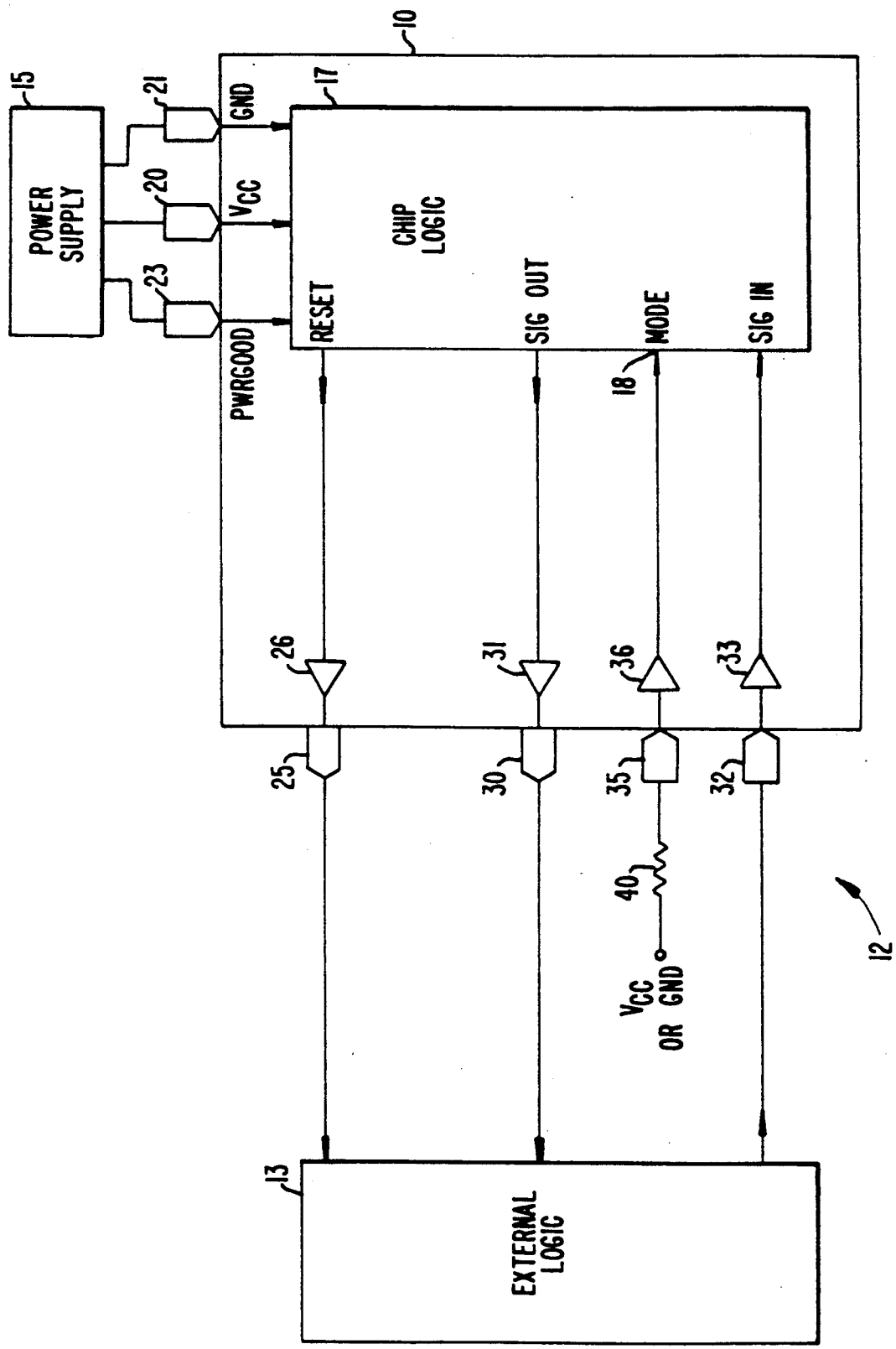
FIG. 1 is a block diagram illustrating a prior art configuration for implementing a multi-mode feature on a chip.

FIG. 1 is a block diagram showing an integrated circuit device 10, hereinafter referred to as chip 10, incorporated into a system 12. Chip 10 is mounted on a circuit board, which may be one of several in the system. The system includes circuitry outside chip 10, which is designated as external logic 13, and a power supply 15. Chip 10 communicates with off-chip elements via a number of connection pins. Chip 10 includes circuitry, referred to as chip logic 17, as well as drivers and receivers coupled to its connection pins.

Chip logic 17 is capable of operation in more than one mode, depending on signals at a control input 18 on the chip, shown for simplicity as a single-bit input. A typical type of information provided at that control input might relate to the specific type of off-chip memory device or peripheral device that is in the system.

Chip 10 is considerably simplified and is shown with seven pin connections. These include input power pins 20 and 21 for $V_{CC}$ and ground from the power supply, an input pin 23 for a PWRGOOD signal from the power supply, an output pin 25 with associated output driver 26 for providing a RESET signal to the external logic (RESET may also be used internally), an output signal pin 30 with associated driver 31 for communicating a signal from the chip logic to the external logic, an input signal pin 32 with associated receiver 33 for communicating a signal from the external logic to the chip logic, and a mode select input pin 35 with associated receiver 36 for providing an externally generated signal level to control input 18.

Control input 18 provides for multi-mode operation of chip 10, depending on the signal at mode select input pin 35. Pin 35 is shown tied to $V_{CC}$ or ground with a resistor 40. As noted above, this schematic is highly simplified. In fact, a chip of the type in question might have as many as 160 or more pins, including multiple power pins and presumably many signal pins. Additionally, depending on the chip design, it may have many mode select input pins.

FIG. 2 is a block diagram of a first embodiment of the present invention wherein the chip can be operated in a selected mode without the need for a separate mode select pin. Elements corresponding or generally corresponding to elements in FIG. 1 will use the reference numerals of FIG. 1, increased by 100.

As before, chip 110 provides an external RESET signal on a RESET pin 125 (as well as an internal version) and a signal to external logic 113 on an output signal pin 130. The present invention reconfigures the chip circuitry relative to that in FIG. 1 in order to make it possible to use signal pin 130 as a mode select pin as well. More particularly, the chip includes a receiver 136 whose input is also coupled to signal pin 130. The receiver output is coupled to the data input of a latch 150, the data output of which is coupled to control input 118 on chip logic 117. Signal driver 131 has a disable input connected to the internal version of the RESET signal so that it is disabled during reset. An off-chip driver 155, having its input pulled to $V_{CC}$ or ground via a resistor 140 drives pin 130, but is enabled only during reset. The need for an active drive (as opposed to just a pull-up or pull-down resistor) arises since signal pin 130 may be connected to a pull-up or pull-down resistor in external logic 113. Latch 150 is clocked at its clock input during the reset interval.

FIG. 3 is a timing diagram showing the sequence of signals at power-on. The PWRGOOD signal is provided by the power supply, and becomes active when the voltage is at a level that can ensure reliable operation of the chip. The chip logic generates a RESET pulse having a predefined duration following the assertion of PWRGOOD. According to the invention, the chip logic also generates a LATCH pulse which is asserted at the same time as reset is asserted, but is withdrawn before the end of the reset pulse. Latch 150 is clocked on the trailing edge of the LATCH pulse.

The timing of LATCH is constrained relative to RESET. First, the trailing edge must occur enough after RESET has been asserted that the data at the latch data input is valid. The trailing edge must also occur enough before RESET is withdrawn to satisfy the hold time requirement of the latch (the input data to the latch must remain stable for some time after the clock edge). Another requirement on the LATCH signal is that it only clocks the latch the one time during the reset interval. In the preferred embodiment, the LATCH pulse is half as long as the reset pulse.

The operation of the first embodiment is as follows. When power comes up, RESET and LATCH are asserted and signal buffer 131 is disabled. At the same time, off-chip driver 155 is enabled and drives pin 130 so as to present the desired high or low mode select level to the input of latch 150. This mode select level is latched when LATCH is withdrawn (RESET is still asserted), and applied to control input 118. Once RESET is withdrawn, driver 155 is disabled, thereby being effectively uncoupled from signal pin 130, driver 131 is enabled, allowing the chip to communicate via signal pin 130 in the normal course of operation, and the latched signal level from latch 150 continues to be presented at control input 118.

Figure 4:
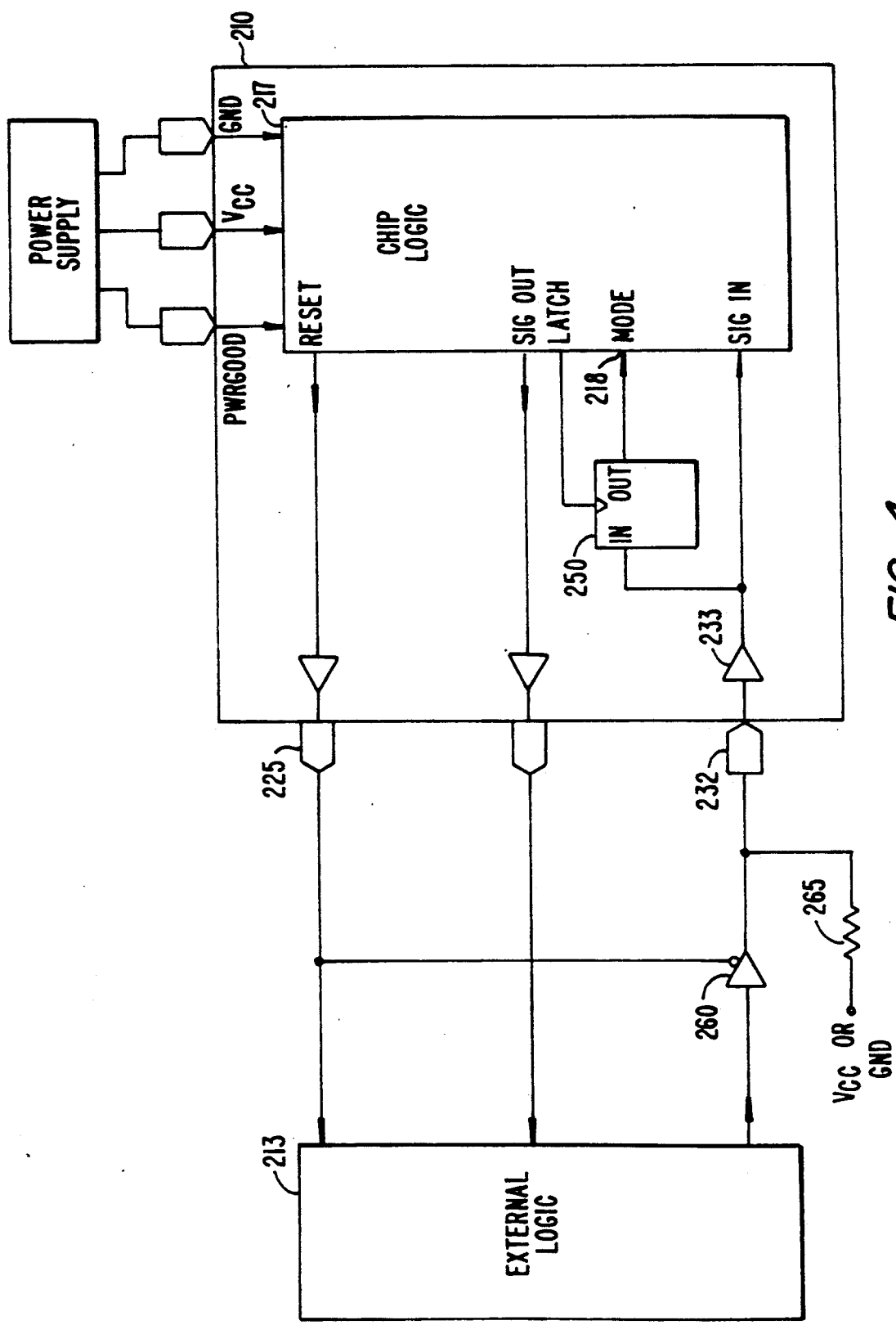
FIG. 4 is a block diagram of a second embodiment of the present invention for implementing a multi-mode feature on a chip.

FIG. 4 is a block diagram of a second embodiment of the present invention wherein the chip can be operated in a selected mode without the need for a separate mode select pin. Elements corresponding or generally corresponding to elements in FIG. 1 will use the reference numerals of FIG. 1, increased by 200.

As before, chip 210 provides an external RESET signal on a RESET pin 225 (as well as an internal version) and receives a signal from external logic 213 on an input signal pin 232. The present invention reconfigures the chip circuitry relative to that in FIG. 1 in order to make it possible to use input signal pin 232 as a mode select pin as well. More particularly, the output of receiver 233 is also coupled to the input of a latch 250, the output of which is coupled to control input 218 on chip logic 217. An off-chip driver 260 is interposed in the path between external logic 213 and input signal pin 232, and is disabled only during RESET. Pin 232 is pulled to $V_{CC}$ or ground via a resistor 265.

The operation of the second embodiment is as follows. When power comes up, RESET and LATCH are asserted and signal driver 260 is disabled. Resistor 265 pulls pin 232 to the desired high or low mode select level. This mode select level is latched when LATCH is withdrawn (RESET is still asserted), and applied to control input 218. Once RESET is withdrawn, driver 260 is enabled, allowing the external logic to communicate with the chip via signal pin 232 in the normal course of operation, and the latched signal level from latch 250 continues to be presented at control input 218.

In conclusion, it can be seen that the present invention provides a simple and effective technique for providing mode selection information (or any other static information) to a chip without requiring a separate pin for that function.

While the above is a complete description of a preferred embodiment of the invention, it will be appreciated that various modifications, alternatives, and equivalents may be used. For example, while RESET is shown as originating on-chip, it could originate off-chip. In such a case, however, the timing of LATCH becomes trickier since the LATCH pulse must be shorter than the RESET pulse. Additionally, PWRGOOD could be generated on-chip, based on the levels on the $V_{CC}$ and ground pins.

Therefore, the above description and illustrations should not be taken as limiting the scope of the invention which is defined by the appended claims.

What is claimed is:

1. In an integrated circuit device with internal circuitry having a portion responsive to a mode select signal at a control input, and a portion coupled to a signal pin, the improvement comprising:
   a latch having a data input coupled to the signal pin, a data output coupled to the control input, and a clock input; and
   means for providing a clock signal to said clock input of said latch during a power-on reset interval, said means being operative to maintain said latch in its latched state beyond the reset interval.

2. The improvement of claim 1 wherein said clock signal includes a signal transition occurring approximately halfway through the reset interval and to which said latch is responsive.

3. In the combination of an integrated circuit device ("chip") and external circuitry, the chip having internal circuitry having a portion responsive to a mode select signal at a control input and a portion coupled to a signal pin, the improvement comprising:
   a latch, on the chip having a data input coupled to the signal pin, a data output coupled to the control input, and a clock input;
   means for providing a power-on reset signal during a reset interval;
   means, off the chip, for supplying a mode selection level to the signal pin;

means, on the chip, for providing a clock signal to said clock input of said latch during said reset interval, said means being operative to maintain said latch in its latched state beyond said reset interval; and means for isolating during said reset interval the signal pin from signals normally communicated between the chip's internal circuitry and the external circuitry to allow said latch to store said mode select signal.

4. The improvement of claim 2 wherein said clock signal includes a signal transition occurring approximately halfway through the reset interval and to which said latch is responsive.

5. An integrated circuit device with internal circuitry having a portion responsive to a mode select signal at a control input, and a portion coupled through a driver to an output signal pin, the improvement comprising:

a latch having a data input coupled to the signal pin, a data output coupled to the control input, and a clock input;

means for disabling the driver coupled to the signal pin during a power-on reset interval; and means for providing a clock signal to said clock input of said latch during said reset interval, said means being operative to maintain said latch in its latched state beyond the reset interval.

6. The improvement of claim 5 wherein said clock signal includes a signal transition occurring approximately halfway through the reset interval and to which said latch is responsive.

7. In an integrated circuit device with internal circuitry having a portion responsive to a mode select signal at a control input, and a portion coupled through a receiver to a signal pin, the improvement comprising:

a latch having a data input coupled to the signal pin, a data output coupled to the control input, and a clock input; and means for providing a clock signal to said clock input of said latch during a power-on reset interval, said means being operative to maintain said latch in its latched state beyond said reset interval.

8. The improvement of claim 7 wherein said clock signal includes a signal transition occurring approximately halfway through the reset interval and to which said latch is responsive.

* * * * *